US012774535B2

(12) United States Patent
Horng et al.

(10) Patent No.: US 12,774,535 B2
(45) Date of Patent: Oct. 27, 2026

(54) METHOD FOR THE FABRICATION OF P-TYPE $Ga_2O_3$ BY PHOSPHORUS ION IMPLANTATION

(71) Applicant: National Yang Ming Chiao Tung University, Hsinchu City (TW)

(72) Inventors: Ray-Hua Horng, Hsinchu City (TW); Xin-Ying Tsai, Hsinchu City (TW)

(73) Assignee: National Yang Ming Chiao Tung University, Hsinchu City (TW)

( * ) Notice: Subject to any disclaimer, the term of this patent is extended or adjusted under 35 U.S.C. 154(b) by 302 days.

(21) Appl. No.: 18/595,493

(22) Filed: Mar. 5, 2024

(65) Prior Publication Data

US 2025/0137168 A1 May 1, 2025

Related U.S. Application Data

(60) Provisional application No. 63/545,954, filed on Oct. 27, 2023.

(51) Int. Cl.

| | |
|---|---|
| ***C30B 25/16*** | (2006.01) |
| ***C30B 29/16*** | (2006.01) |
| ***C30B 31/22*** | (2006.01) |
| ***C30B 33/02*** | (2006.01) |

(52) U.S. Cl.

CPC .............. *C30B 31/22* (2013.01); *C30B 25/16* (2013.01); *C30B 29/16* (2013.01); *C30B 33/02* (2013.01)

(58) Field of Classification Search

CPC ......... C30B 31/22; C30B 25/16; C30B 29/16; C30B 33/02

See application file for complete search history.

(56) References Cited

U.S. PATENT DOCUMENTS

| | | | | |
|---|---|---|---|---|
| 10,431,717 | B1 * | 10/2019 | Dasgupta | H10H 20/819 |
| 11,152,225 | B1 * | 10/2021 | Hara | H10P 32/14 |
| 2019/0115434 | A1 * | 4/2019 | Sakumoto | H10D 30/63 |
| 2019/0242839 | A1 * | 8/2019 | Horng | G01N 27/04 |
| 2023/0074175 | A1 * | 3/2023 | Peterson | H10D 30/4732 |

FOREIGN PATENT DOCUMENTS

| | | | | |
|---|---|---|---|---|
| CN | 111916341 | * | 11/2020 | |
| CN | 114203548 A | * | 3/2022 | H10P 30/202 |
| WO | WO-2019218581 A1 | * | 11/2019 | H10P 14/24 |

* cited by examiner

*Primary Examiner* — Robert M Kunemund

(74) *Attorney, Agent, or Firm* — Amin, Turocy & Watson, LLP

(57) ABSTRACT

A method for the fabrication of p-type $Ga_2O_3$ by phosphorus ion implantation, wherein the method comprises: growing gallium oxide epilayer having a predetermined thickness on a substrate by controlling a growth temperature and a growth pressure; and implanting phosphorus ions on the gallium oxide epilayer by providing the phosphorus ion with a predetermined energy, wherein the phosphorus ions were implanted with a predetermined doses and with a predetermined incident angle.

9 Claims, 5 Drawing Sheets

METHOD FOR THE FABRICATION OF P-TYPE $Ga_2O_3$ BY PHOSPHORUS ION IMPLANTATION

CROSS-REFERENCE TO RELATED APPLICATIONS

The present application claims the priority of U.S. Provisional Patent Application No. 63/545,954 filed Oct. 27, 2023, the disclosure of which is hereby incorporated by reference herein in its entirety.

BACKGROUND OF THE INVENTION

1. Field of the Invention

The present disclosure generally relates to a method for fabrication of p-type $Ga_2O_3$, particularly, to a method for fabrication of p-type $Ga_2O_3$ by phosphorus ion implantation.

2. Description of the Related Art

Among the materials under consideration for power devices in semiconductor technology, gallium oxide, $Ga_2O_3$, stands out as an extremely promising candidate, boasting exceptional characteristics, including a wide bandgap, a high breakdown electrical field strength and remarkable thermal stability, which make $Ga_2O_3$ suitable for high-power electronic devices, optoelectronics, and power electronics.

Recently, significant research efforts have been dedicated to customizing the electrical properties of $Ga_2O_3$ to further enhance its performance. They have focused on various approaches, including homojunction epitaxial growth, heterojunction epitaxial growth on sapphire substrates, and the study of doping technologies. However, the attainment of p-type doping remains a formidable challenge. P-type doping in ultrawide bandgap, UWBG, semiconductors, which are crucial materials for next-generation high-performance optoelectronic and electronic devices, has proven exceedingly difficult to achieve.

Accordingly, inventors of the present inventive concept conduct a deep discussion on the aforementioned requirement based on the research experiments in the related fields and seek for a solutions actively. The inventors finally accomplish the present inventive concept and improve the progressively and practicality.

SUMMARY OF THE INVENTION

In light of solving the foregoing problems of the prior art, the present inventive concept provides a method for the fabrication of p-type $Ga_2O_3$ by phosphorus ion implantation, comprising:

- growing gallium oxide epilayer having a predetermined thickness on a substrate by controlling a growth temperature and a growth pressure; and
- implanting phosphorus ions on the gallium oxide epilayer by providing the phosphorus ion with a predetermined energy, wherein the phosphorus ions are implanted with a predetermined doses and with a predetermined incident angle.

According to the present inventive concept, the step of growing the gallium oxide epilayer comprises introducing organogallium compound and oxygen as Ga and O precursors, respectively.

According to the present inventive concept, the organogallium compound is selected from the group consisting of triethylgallium and trimethylgallium.

According to the present inventive concept, the predetermined thickness of the gallium oxide epilayer is above 50 nm.

According to the present inventive concept, the growth temperature is controlled within a range of 650° C. to 1200° C.

According to the present inventive concept, the organogallium compound has a flowrate of 100 sccm and the oxygen has a flowrate of 500 sccm to 2000 sccm.

According to the present inventive concept, the growth pressure is 15 torr to 760 torr.

According to the present inventive concept, the step of implanting phosphorus ions on the gallium oxide epilayer comprises providing the phosphorus ion with a predetermined energy which is 200 keV from an energy beam.

According to the present inventive concept, the step of implanting phosphorus ions on the gallium oxide epilayer comprises implanting the phosphorus ions with a predetermined incident angle which is inclined 7° in relation to the energy beam normal at room temperature.

According to the present inventive concept, the step of implanting phosphorus ions on the gallium oxide epilayer comprises implanting the phosphorus ions with doses ranging from $2.5\times10^{12}$ $cm^{-2}$ to $1.6\times10^{15}$ $cm^{-2}$.

According to the present inventive concept, the step of implanting phosphorus ions on the gallium oxide epilayer comprises implanting the phosphorus ions with ion energy ranging from 40 to 100 keV into gallium oxide epilayers.

According to the present inventive concept, the method further comprises activating the phosphorus-ion implanted gallium oxide epilayers at 900° C. to 1200° C. in a $N_2$ environment by rapid thermal annealing.

The present inventive concept provides a novel phosphorus ion implantation techniques employing various ion implantation parameters for acceptor doping of p-type $\beta$-$Ga_2O_3$.

DETAILED DESCRIPTION

The present inventive concept is described by the following specific embodiments. Those with ordinary skills in the arts can readily understand other advantages and functions of the present inventive concept after reading the disclosure of this specification. Any changes or adjustments made to their relative relationships, without modifying the substantial technical contents, are also to be construed as within the range implementable by the present inventive concept.

Moreover, the word "exemplary" or "embodiment" is used herein to mean serving as an example, instance, or illustration. Any aspect or design described herein as exemplary or an embodiment is not necessarily to be construed as preferred or advantageous over other aspects or designs. Rather, use of the word "exemplary" or "embodiment" is intended to present concepts and techniques in a concrete fashion.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

Figure 1:
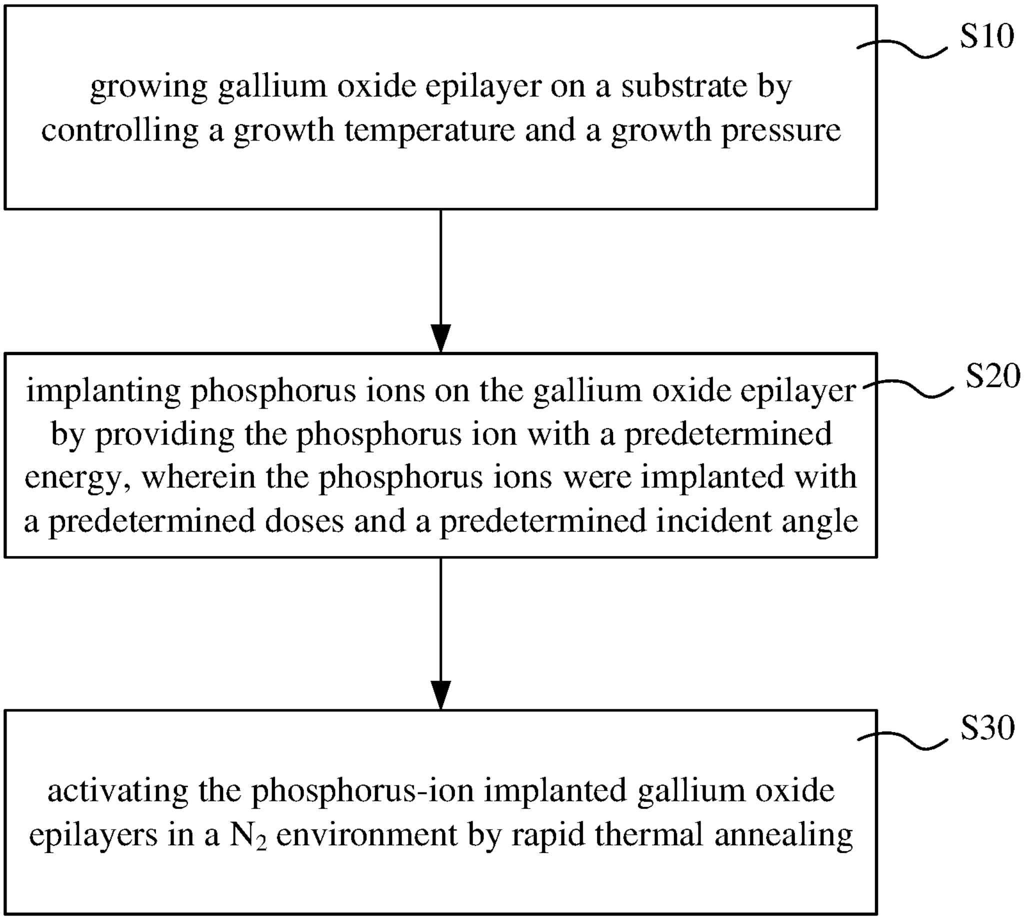
FIG. 1 is a schematic flow diagram of the method according to the present inventive concept.

Please refer to FIG. 1 which is a schematic flow diagram of the method according to the present inventive concept. The present inventive concept provides a method a method for the fabrication of p-type $Ga_2O_3$ by phosphorus ion implantation, comprising:

S10 growing gallium oxide epilayer having a predetermined thickness on a substrate by controlling a growth temperature and a growth pressure; and S20 implanting phosphorus ions on the gallium oxide epilayer by providing the phosphorus ion with a predetermined energy, wherein the phosphorus ions are implanted with a predetermined doses and with a predetermined incident angle.

According to an embodiment of the present inventive concept, the step of growing the gallium oxide epilayer may comprise introducing organogallium compound and oxygen as Ga and O precursors, respectively.

According to an embodiment of the present inventive concept, the organogallium compound may be selected from the group consisting of triethylgallium and trimethylgallium.

According to an embodiment of the present inventive concept, the predetermined thickness of the gallium oxide epilayer may be above 50 nm.

According to an embodiment of the present inventive concept, the growth temperature mat be controlled within a range of 650° C. to 1200° C. Preferably, the growth temperature mat be controlled within a range of 650° C. to 900° C.

According to an embodiment of the present inventive concept, the organogallium compound may have a flowrate of 100 sccm and the oxygen has a flowrate of 500 sccm to 2000 sccm. Preferably, the oxygen has a flowrate of 1000 sccm to 2000 sccm.

According to an embodiment of the present inventive concept, the growth pressure may be 15 torr to 760 torr.

According to an embodiment of the present inventive concept, the step of implanting phosphorus ions on the gallium oxide epilayer may comprise providing the phosphorus ion with a predetermined energy which may be 200 keV from an energy beam.

According to an embodiment of the present inventive concept, the step of implanting phosphorus ions on the gallium oxide epilayer may comprise implanting the phosphorus ions with a predetermined incident angle which is inclined 7° in relation to the energy beam normal at room temperature.

According to an embodiment of the present inventive concept, the step of implanting phosphorus ions on the gallium oxide epilayer may comprise implanting the phosphorus ions with doses ranging from $1\times10^{12}$ $cm^{-2}$ to $1.6\times10^{15}$ $cm^{-2}$.

More specifically, the step of implanting phosphorus ions on the gallium oxide epilayer may comprise implanting the phosphorus ions with doses ranging from $1\times10^{13}$ $cm^{-2}$ to $1.6\times10^{15}$ $cm^{-2}$.

According to an embodiment of the present inventive concept, the step of implanting phosphorus ions on the gallium oxide epilayer may comprise implanting the phosphorus ions with ion energy ranging from 40 to 100 keV into gallium oxide epilayers.

According to the present inventive concept, the method may further comprise: S30 activating the phosphorus-ion implanted gallium oxide epilayers at 900° C. to 1200° C. in a $N_2$ environment by rapid thermal annealing. Preferably, the method may further comprise activating the phosphorus-ion implanted gallium oxide epilayers at 1000° C. in a $N_2$ environment by rapid thermal annealing.

The following examples are provided to illustrate the present inventive concept as well as some advantages obtained therefrom.

The Fabrication of the p-Type $Ga_2O_3$

SRIM and SIMS

According to the present inventive concept, Stopping and Range of Ions in Matter, SRIM, simulations may be utilized to optimize the dose, depth, energy, and concentration of the phosphorus-ion implantation. Secondary ion mass spectroscopy, SIMS, may be used to verify the simulation accuracy.

Figure 2:
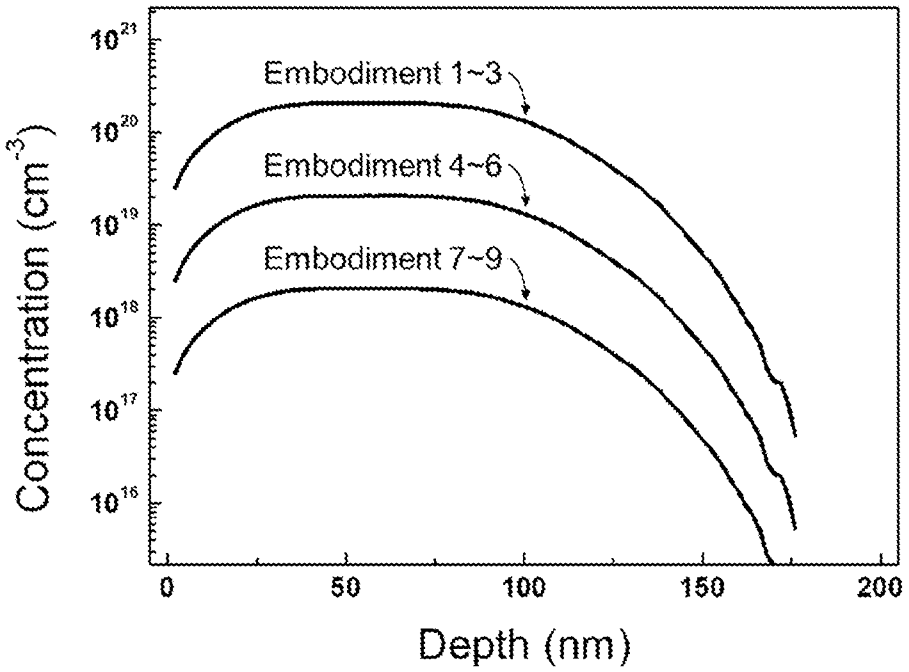
FIG. 2 shows the depth profile simulation by SRIM with phosphorus-ions dose ranges with low, medium and high doses using different implantation energy.
Figure 3:
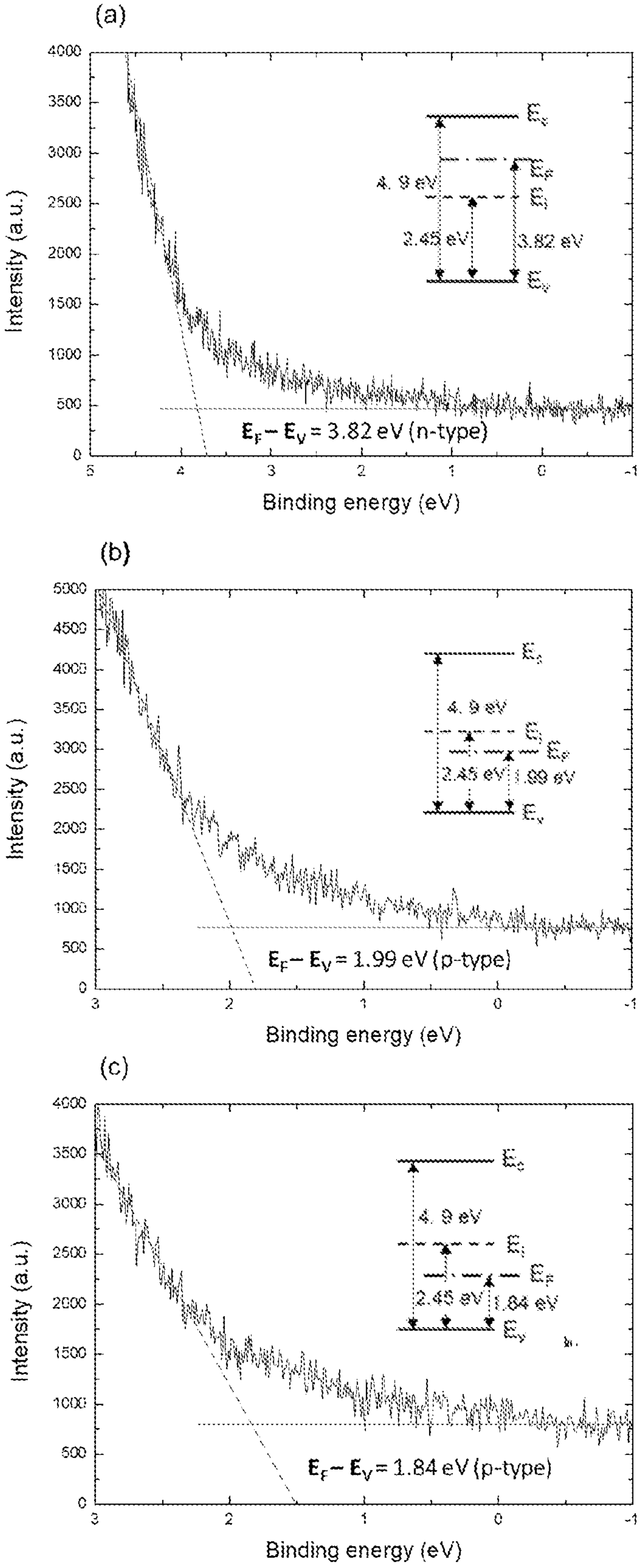
FIG. 3 shows the correlation between the amount of states in the lower half of the bandgap and the p-type characters of the embodiments according to the present inventive concept with (a) low, (b) medium and (c) high phosphorus-ions doses and the corresponding energy bandgaps of the embodiments according to the present inventive concept.

Please note that the phosphorus-ion concentration, $atoms\cdot cm^{-3}$, obtained from the SRIM software may be computed by multiplying the number of ions, atoms·cm, with the applied dose, $atoms\cdot cm^{-2}$. Please refer to FIG. 2. The simulated distributions of phosphorus ions with low, medium and high phosphorus ion implantation doses are shown in FIG. 2. The corresponding concentrations of low, medium and high doses were $2\times10^{18}$, $2\times10^{19}$ and $2\times10^{20}$ $atoms\cdot cm^{-3}$.

The X-ray diffraction, XRD, system may be employed to measure the crystallinity of both unintentional-doped, UID, and implanted $\beta$-$Ga_2O_3$ epilayers, before and after the implanted $\beta$-$Ga_2O_3$ epilayers were activated.

To measure the phosphorus-ions depth and concentration of the implanted $\beta$-$Ga_2O_3$ post-rapid thermal annealing, post-RTA, treatment, depth profiling of elements such as Ga, O, Al, P, and C may be conducted by "Cameca IMS 7F" SIMS with a 15 kV cesium surface ionization source.

Surface morphology and cross-sectional images of UID and activated phosphorous-ions implanted $\beta$-$Ga_2O_3$ epilayers may be captured by a "Hitachi S-4700I" Scanning Electron Microscope, SEM, at 5 keV. High-resolution TEM cross-sectional images may also be taken to assess the lattice damage caused by the ion implantation process. To further examine the concentration of elements in UID and phosphorous-ion implanted samples, with and without activation, they are identified by SIMS. All element distributions are calibrated with the binding energy.

Embodiments 1

In a specific embodiment of the present inventive concept, UID $\beta$-$Ga_2O_3$ epilayers were grown on a c-plane sapphire substrate by metalorganic chemical vapor deposition, MOCVD.

In this embodiment, the thickness of UID β-$Ga_2O_3$ epilayers may be about 200 nm. Triethylgallium, TEGa, and oxygen (99.999% of purity) may be utilized as Ga and O precursors, respectively. The flow rates of TEGa and oxygen may be 100 sccm and 500 sccm, correspondingly, with a growth pressure maintained at 15 Torr.

Then, phosphorus ion implantation may be performed on the β-$Ga_2O_3$ epilayer by an ion implantation system. This system may generate a high-energy beam of up to about 200 keV, and the ions produced may be derived from the source provided. The incident angle may be inclined 7° in relation to the beam normal at room temperature during implantation.

The phosphorus ions may be implanted with a high dose about $2.5\times10^{14}$ $cm^{-2}$ with ion energy of 40 keV into β-$Ga_2O_3$ epilayers.

Phosphorus-ion implanted β-$Ga_2O_3$ epilayers may be subsequently activated at about 1000° C. in a $N_2$ environment for one minute using an RTA system.

Embodiments 2

The process of the fabrication of p-type $Ga_2O_3$ is similar to the one of Embodiment 1.

However, the phosphorus ions may be implanted with a high dose about $1\times10^{14}$ $cm^{-2}$ with ion energy of 50 keV into β-$Ga_2O_3$ epilayers.

Embodiments 3

The process of the fabrication of p-type $Ga_2O_3$ is similar to the one of Embodiment 1.

However, the phosphorus ions may be implanted with a high dose about $1.6\times10^{15}$ $cm^{-2}$ with ion energy of 100 keV into β-$Ga_2O_3$ epilayers.

Embodiments 4

The process of the fabrication of p-type $Ga_2O_3$ is similar to the one of Embodiment 1.

However, the phosphorus ions may be implanted with a medium dose which is about $2.5\times10^{13}$ $cm^{-2}$ with ion energy of 40 keV into β-$Ga_2O_3$ epilayers.

Embodiments 5

The process of the fabrication of p-type $Ga_2O_3$ is similar to the one of Embodiment 1.

However, the phosphorus ions may be implanted with a medium dose which is about $1\times10^{13}$ $cm^{-2}$ with ion energy of 50 keV into β-$Ga_2O_3$ epilayers.

Embodiments 6

The process of the fabrication of p-type $Ga_2O_3$ is similar to the one of Embodiment 1.

However, the phosphorus ions may be implanted with a medium dose which is about $1.6\times10^{14}$ $cm^{-2}$ with ion energy of 40 keV into β-$Ga_2O_3$ epilayers.

Embodiments 7

The process of the fabrication of p-type $Ga_2O_3$ is similar to the one of Embodiment 1.

However, the phosphorus ions may be implanted with a low dose about $2.5\times10^{12}$ $cm^{-2}$ with ion energy of 40 keV into β-$Ga_2O_3$ epilayers.

Embodiments 8

The process of the fabrication of p-type $Ga_2O_3$ is similar to the one of Embodiment 1.

However, the phosphorus ions may be implanted with a low dose about $1\times10^{12}$ $cm^{-2}$ with ion energy of 50 keV into β-$Ga_2O_3$ epilayers.

Embodiments 9

The process of the fabrication of p-type $Ga_2O_3$ is similar to the one of Embodiment 1.

However, the phosphorus ions may be implanted with a low dose about $1.6\times10^{13}$ $cm^{-2}$ with ion energy of 100 keV into β-$Ga_2O_3$ epilayers.

According to the present inventive concept, multiple ion energies with different implanted phosphorus ion doses is to achieve a uniform profile with a plateau concentration.

According to the present inventive concept, the nature of ion implantation may cause the near-surface regions of the implanted areas to have lower phosphorus density. The use of dose ions with multiple energies may help to ensure a high phosphorus concentration, even near the surface regions.

Ultraviolet Photoelectron Spectroscopy

Ultraviolet photoelectron spectroscopy, UPS, is an excellent measurement to investigate the valence band characteristics of the epilayers and provides additional evidence of the presence of states within the bandgap. As used in high resolution in the valence band vicinity, i.e. for the lowest binding energies, it is possible to directly detect whether there are states in the lower part of the bandgap, which is responsible for p-type character. The activated phosphorus implanted $Ga_2O_3$ epilayers of the embodiments of the present inventive concept may be analyzed by UPS.

Please refer to FIG. 2 which shows the analysis of the UPS of the embodiments of the present inventive concept. It is found that an obvious correlation between the amount of states in the lower half of the bandgap and the p-type characters of the embodiments with the low, medium and high implantation doses in sequence. For these embodiments of the present inventive concept, the Fermi level near the valence band in the embodiments with low, medium and high implantation phosphorous ion doses are 3.82 eV, 1.99 and 1.84 eV, respectively.

Besides, the corresponding energy bandgaps of the embodiments of the present inventive concept are also shown in the insets of FIG. 2. Obviously, regarding the $Ga_2O_3$ of the embodiments of the present inventive concept with the medium and high implantation phosphorus ion doses, from the extrapolation of the valence band edge, the value of $E_F$ is lower than the value of $E_i$ value and p-type characters are observed. According to the present inventive concept, the increasing concentration of phosphorous results in the value $E_F$ closing to the value of $E_V$. However, for the embodiments implanted by low phosphorus ion dose, the n-type characters are observed although the concentration of phosphorus is $2\times10^{18}$ $cm^{-3}$.

Hall Measurements and SIMS

According to the present inventive concept, Ni/Au metals with 20/100 nm thickness may be further deposited on the implanted β-$Ga_2O_3$ epilayers of the embodiments of the present inventive concept, followed by RTA at 600° C. in a $N_2$ environment for one minute for Hall measurement to evaluate the electrical properties of the embodiments of the present inventive concept.

The obtained results were shown in Table 1. It is found that for the $Ga_2O_3$ epilayers of the embodiments with medium implantation phosphorus ion dose, its phosphorus concentration is $2\times10^{19}$ $cm^{-3}$, the $Ga_2O_3$ epilayer become p-type and the hole concentration is $1.612\times10^{18}$ $cm^{-3}$ by Hall measurement. The resistivity and hole mobility of the $Ga_2O_3$ epilayer is about 9.699 Ω·cm and 0.399 $cm^2/V\cdot s$, respectively. The p-type $Ga_2O_3$ epilayer was also obtained by UPS.

Regarding the $Ga_2O_3$ epilayers of the embodiments with high implantation phosphorus ion dose, it is still p-type which is also shown in the result of UPS. The hole concentration is $6.428\times10^{17}$ $cm^{-3}$. The resistivity and hole mobility of the $Ga_2O_3$ epilayer is about 6.439 Ω·cm and 1.51 $cm^2/V\cdot s$, respectively.

Figure 4:
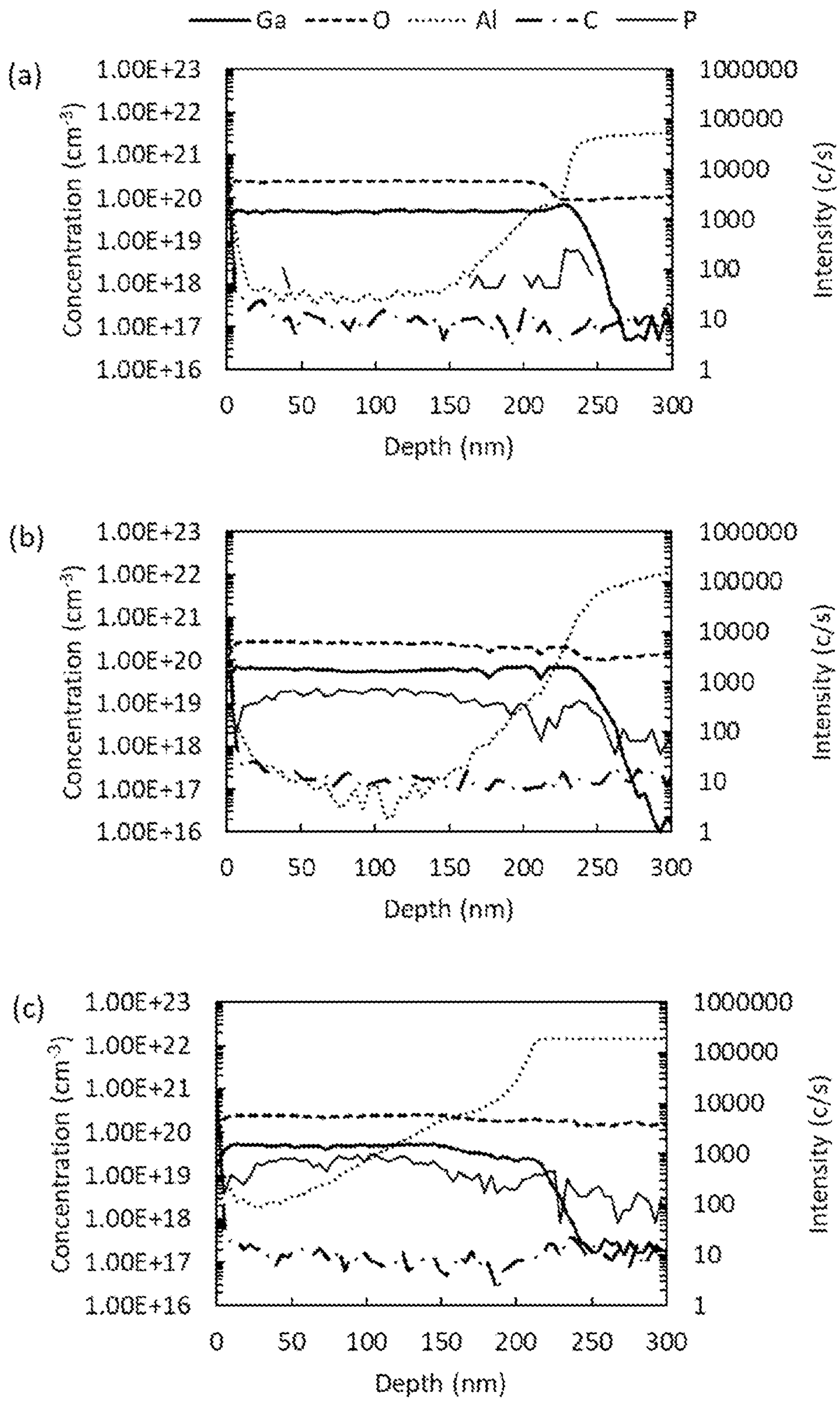
FIG. 4 shows the concentration of elements, Ga, O, Al, C (refer to the right y-axis), and P (refers to the left y-axis), in (a) UID and the embodiments of phosphorous-ion implanted samples according to the present inventive concept, (b) without and (c) with rapid thermal annealing activation.

Please refer to FIG. 4 which show the concentration of elements in (a) UID and phosphorous ion implanted samples, (b) without and (c) with RTA activation by SIMS, wherein the right y-axis is referred to as the intensity of Ga, O, Al and C and the left y-axis is referred to as the concentration of P. Further refer to FIG. 5 which show the concentration of elements in the embodiments according to the present inventive concept with (a) low, (b) medium and (c) high implantation phosphorus ion doses, wherein the right y-axis is referred to as the concentration of P and the left y-axis is referred to as the intensity of Ga, O and Al.

Figure 5:
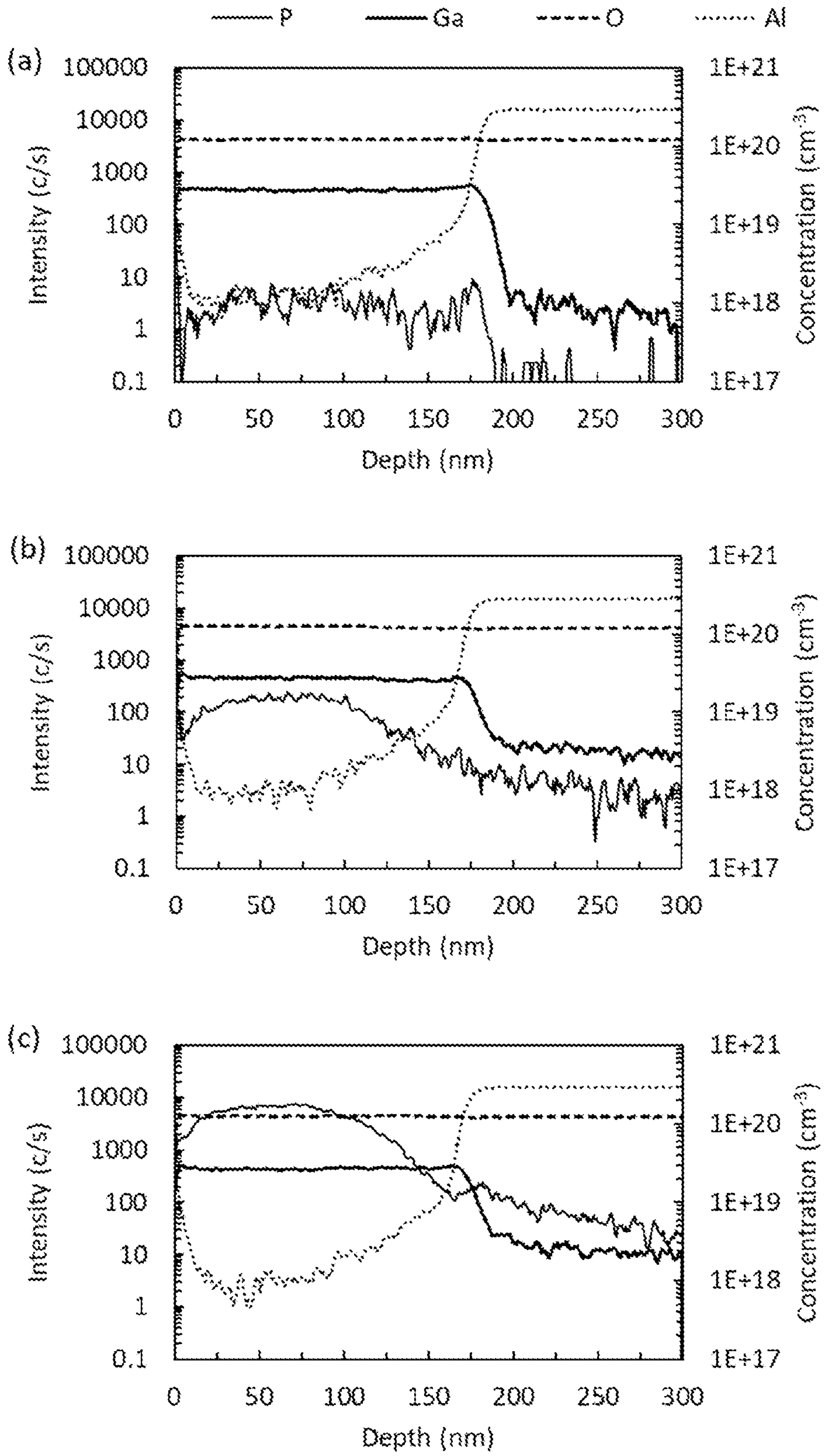
FIG. 5 shows the concentration of elements, Ga, O, Al, (refer to the left y-axis), and P (refers to the right y-axis), in the embodiments according to the present inventive concept with (a) low, (b) medium and (c) high phosphorus-ions doses.

The distribution of phosphorus was remarkably uniform within the epilayer and measured about $2\times10^{18}$ $cm^{-3}$ in the embodiment according to the present inventive concept with the low dose, as illustrated in FIG. 5(*a*). For the embodiments according to the present inventive concept with the medium and high doses, the maximum phosphorous distributions reached around $2\times10^{19}$ and $2\times10^{20}$ $cm^{-3}$, respectively, as shown in FIGS. 5(*b*) and (*c*).

However, it is found that the $Ga_2O_3$ epilayers of the embodiments with low implanted phosphorus ion doses are almost become insulators because their resistivity is too high to measure the Hall effect. From the results of UPS, it indicates that some deep defects are existed in the samples of the embodiments with low implanted phosphorus ion doses. Although the phosphorus concentration measured by SIMS is $2\times10^{18}$ $cm^{-3}$, these impurities may be used to compensate with the native oxygen vacancy.

The low phosphorus ion concentration may lead to the destruction of the lattice of $Ga_2O_3$ epilayer before annealed, which may result in more possibility for the phosphorus-aluminum interdiffusion in the interface between the epilayer and the sapphire substrate. Because more phosphorus may diffuse into the sapphire substrate and aluminum may diffuse out from the substrate, they result in the low hole concentration of the $Ga_2O_3$ epilayer after the RTA processing.

Please note that the highest phosphorus ion concentrations achieved for the embodiments according to the present inventive concept with low, medium and high implantation phosphorus ion doses are $2\times10^{18}$, $2\times10^{19}$, and $2\times10^{20}$ $cm^{-3}$, respectively, which closely match the predictions from the SRIM simulations.

TABLE 1

Electrical properties of the ion implanted $Ga_2O_3$ epilayers of the embodiments of the present inventive concept

| | Electrical properties | | | |
|---|---|---|---|---|
| | Resistivity (Ω-cm) | Hall Coefficient ($m^2/C$) | Mobility ($cm^2/V\cdot s$) | Concentration ($cm^{-3}$) |
| Low dose | — | — | — | — |
| Medium dose | 9.699 | +19.4 | 0.399 | $1.612\times10^{18}$ |
| High dose | 6.439 | +48.5 | 1.51 | $6.428\times10^{17}$ |

In summary, the present inventive concept provides a method to fabricate a p-type $Ga_2O_3$ epilayer by direct phosphorus ion implantation. It allows the achievement of p-type β-$Ga_2O_3$ through this novel phosphorus ion implantation techniques.

The foregoing descriptions of the detailed embodiments are only illustrated to disclose the features and functions of the present inventive concept and not restrictive of the scope of the present inventive concept. It should be understood to those in the art that all modifications and variations according to the spirit and principle in the disclosure of the present inventive concept should fall within the scope of the appended claims.

What is claimed is:

1. A method for the fabrication of p-type $Ga_2O_3$ by phosphorus ion implantation, comprising:

growing gallium oxide epilayer having a predetermined thickness on a substrate by controlling a growth temperature and a growth pressure; and implanting phosphorus ions on the gallium oxide epilayer by providing the phosphorus ion with a predetermined energy, wherein the phosphorus ions were implanted with a predetermined doses and with a predetermined incident angle; and activating the phosphorus-ion implanted gallium oxide epilayers at 900° C. to 1200° C. in a $N_2$ environment by rapid thermal annealing.

2. The method of claim 1, wherein the step of growing the gallium oxide epilayer comprises introducing organogallium compound and oxygen as Ga and O precursors, respectively.

3. The method of claim 2, wherein the organogallium compound is selected from the group consisting of triethylgallium and trimethylgallium.

4. The method of claim 1, wherein the predetermined thickness of the gallium oxide epilayer is above 50 nm.

5. The method of claim 1, wherein the growth temperature is controlled within a range of 650° C. to 1200° C.

6. The method of claim 1, wherein the step of implanting phosphorus ions on the gallium oxide epilayer comprises providing the phosphorus ion with a predetermined energy which is 200 keV from an energy beam.

7. The method of claim 1, wherein the step of implanting phosphorus ions on the gallium oxide epilayer comprises implanting the phosphorus ions with a predetermined incident angle which is inclined 7° in relation to the energy beam normal at room temperature.

8. The method of claim 1, wherein the step of implanting phosphorus ions on the gallium oxide epilayer comprises implanting the phosphorus ions with doses ranging from $2.5\times10^{12}$ $cm^{-2}$ to $1.6\times10^{15}$ $cm^{-2}$.

9. The method of claim 1, wherein the step of implanting phosphorus ions on the gallium oxide epilayer comprises implanting the phosphorus ions with ion energy ranging from 40 to 100 keV into gallium oxide epilayers.

* * * * *